(12) United States Patent
Lee et al.

(10) Patent No.: US 8,283,693 B2
(45) Date of Patent: Oct. 9, 2012

(54) LIGHT EMITTING DEVICE WITH A LENS OF SILICONE

(75) Inventors: Chung Hoon Lee, Gwangmyeong-si (KR); Do Hyung Kim, Suwon-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 607 days.

(21) Appl. No.: 11/997,459

(22) PCT Filed: Jul. 26, 2006

(86) PCT No.: PCT/KR2006/002943
§ 371 (c)(1),
(2), (4) Date: Jan. 31, 2008

(87) PCT Pub. No.: WO2007/015606
PCT Pub. Date: Feb. 8, 2007

(65) Prior Publication Data
US 2008/0191232 A1    Aug. 14, 2008

(30) Foreign Application Priority Data
Aug. 1, 2005    (KR) .......................... 10-2005-0070271

(51) Int. Cl.
*H01L 33/54* (2010.01)
*H01L 33/56* (2010.01)
(52) U.S. Cl. ................................. 257/100; 257/E33.059
(58) Field of Classification Search ............ 257/79–103, 257/666–796, E33.059; 438/22–47, 106–127
See application file for complete search history.

(56) References Cited

U.S. PATENT DOCUMENTS

| 6,580,097 | B1 * | 6/2003 | Soules et al. ................... 257/100 |
| 6,936,855 | B1 * | 8/2005 | Harrah ............................ 257/88 |
| 6,943,433 | B2 * | 9/2005 | Kamada ........................ 257/666 |
| 7,352,011 | B2 * | 4/2008 | Smits et al. ..................... 257/99 |
| 7,391,153 | B2 * | 6/2008 | Suehiro et al. ................ 313/512 |
| 7,416,906 | B2 * | 8/2008 | Tasaki et al. .................... 438/22 |
| 7,633,093 | B2 * | 12/2009 | Blonder et al. ................. 257/81 |
| 2003/0235050 | A1 * | 12/2003 | West et al. ..................... 362/327 |
| 2004/0065894 | A1 * | 4/2004 | Hashimoto et al. ........... 257/100 |
| 2004/0227145 | A1 * | 11/2004 | Abe et al. ....................... 257/98 |

(Continued)

FOREIGN PATENT DOCUMENTS
KR        200531143 A    4/2005

(Continued)

OTHER PUBLICATIONS
Chinese Preliminary Notice of the First Office Action dated Sep. 8, 2009.

*Primary Examiner* — Kiesha Bryant
*Assistant Examiner* — Eric Ward
(74) *Attorney, Agent, or Firm* — H.C. Park & Associates, PLC

(57) ABSTRACT

Disclosed herein is a light emitting device with a silicone lens. The light emitting device comprises a heat sink. A package body surrounds at least a portion of the heat sink, and a light emitting diode is mounted on the heat sink. Meanwhile, the light emitting diode is covered with a silicone lens molded on the package body. The molded silicone lens can be employed to prevent reduction in light extraction efficiency due to poor bonding between lens and encapsulant.

15 Claims, 2 Drawing Sheets

U.S. PATENT DOCUMENTS

| | | |
|---|---|---|
| 2005/0139846 A1 | 6/2005 | Park et al. |
| 2006/0086945 A1* | 4/2006 | Wang et al. ............... 257/99 |
| 2006/0103012 A1* | 5/2006 | Chin ....................... 257/712 |
| 2007/0029559 A1* | 2/2007 | Lee et al. ................. 257/98 |

FOREIGN PATENT DOCUMENTS

| | | |
|---|---|---|
| TW | 200405590 | 4/2004 |
| WO | 2004/021461 A2 | 3/2004 |
| WO | 2004/107461 A1 | 12/2004 |

\* cited by examiner

LIGHT EMITTING DEVICE WITH A LENS OF SILICONE

RELATED APPLICATION

This application is a U.S. national phase application of PCT International Application No. PCT/KR2006/002943, filed Jul. 26, 2006, which claims priority of Korean Patent Application No. 2005-070271, filed Aug. 1, 2005, the contents of which are incorporated herein by reference in their entirety.

FIELD OF THE INVENTION

The present invention relates to a light emitting device, and more particularly, to a light emitting device with a silicone lens formed by molding a silicone encapsulant into a lens shape to improve light extraction efficiency and simplify a manufacturing process.

BACKGROUND OF THE INVENTION

In general, a light emitting device comprises a package body with a recess and a light emitting diode mounted within the recess of the package body. The light emitting diode has advantages in that it has a smaller size, a longer life span and lower power consumption as compared with an incandescent bulb, a fluorescent lamp and a discharge light source.

An encapsulant is used to protect a light emitting diode from external environment, i.e. moisture. The encapsulant covers the light emitting diode and bonding wires to protect them from the external environment. Thus, the light emitting diode is mounted within the package body and then covered with the encapsulant to complete a light emitting diode package.

Hitherto, an epoxy resin has been widely employed as an encapsulant. However, since the epoxy resin causes the disconnection of the bonding wire due to its relatively large hardness and absorbs short wavelength visible light, there are problems of reduction in light flux or yellowing. In order to solve these problems, silicone has been recently used as an encapsulant. It is also known that due to small hardness and strong restoring force of a silicone encapsulant, the occurrence of disconnection of a bonding wire is reduced and the yellowing tendency is not exhibited even though it is used for a long time.

Furthermore, a variety of lenses are attached to an encapsulant to adjust the viewing angle or emission direction of light. However, a prior art for attaching a lens to an encapsulant may lower light extraction efficiency due to poor bonding or refractive index difference between encapsulant and lens, or the like.

Further, in a case where a light emitting diode is mounted within a recess of a package body, it is difficult to predict the path of light emitted to the outside due to light reflection produced on a sidewall of the recess or on an interface between an encapsulant and a lens. Since it is difficult to predict the path of light emitted from a light emitting diode to be incident onto a lens, it is difficult to design a lens capable of precisely adjusting a required viewing angle or emission direction of light.

An object of the present invention is to provide a light emitting device capable of preventing reduction in light extraction efficiency due to an interface between encapsulant and lens.

Another object of the present invention is to provide a light emitting device wherein the path of light emitted from a light emitting diode to be incident onto a lens can be simplified to easily design a lens.

To achieve the aforementioned objects of the present invention, the invention provides a light emitting device with a silicone lens. The light emitting device according to an embodiment of the invention comprises a heat sink. A package body surrounds at least a portion of the heat sink, and a light emitting diode is mounted on the heat sink. Meanwhile, the light emitting diode is covered with a silicone lens molded on the package body. The molded silicone lens can be employed to prevent reduction in light extraction efficiency due to poor bonding between a conventional lens and an encapsulant.

Hereinafter, the light emitting diode means a light emitting diode die or light emitting diode chip. The light emitting diode may be composed of a single diode or a plurality of diodes.

Meanwhile, a top surface of the light emitting diode is positioned at least above a top surface of the package body. In this case, since it is possible to prevent light emitted from the light emitting diode from being reflected on an inner wall of the package body, the path of light incident on the silicone lens can be easily predicted, and thus, the design of lens can also be easily made. The position of the top surface of the light emitting diode is set in accordance with the height of the top surface of the heat sink. The top surface of the heat sink is positioned near the top surface of the package body so that the top surface of the light emitting diode can be positioned at least above the top surface of the package body. The top surface of the heat sink can be positioned in the same plane as or higher than that of the package body.

A silicone encapsulant may be interposed between the silicone lens and the light emitting diode to cover the light emitting diode. Each of the encapsulant and the lens is made of a silicone material. Since the silicone lens is particularly molded on the encapsulant, the reduction in light extraction efficiency due to refractive index difference and poor bonding between lens and encapsulant can be prevented. Meanwhile, the silicone lens and/or silicone encapsulant may contain a phosphor capable of converting the wavelength of light emitted from the light emitting diode. Accordingly, a light emitting diode that generates a single wavelength can be employed to implement multicolored light, e.g. white light.

The silicone lens can be designed in various ways depending on the required viewing angle and/or emission direction of light. For example, the silicone lens may be a convex lens, a concave lens or the like, and may have a total internal reflection surface to emit light in a lateral direction.

According to the embodiment of the present invention, a light emitting device can be provided wherein a silicone lens molded on a package body is employed to prevent the reduction in light extraction efficiency due to poor interface between encapsulant and lens. Further, a light emitting device can be provided wherein the path of light emitted from a light emitting diode to be incident on a lens can be simplified to easily design the lens.

DETAILED DESCRIPTION

Figure 1:
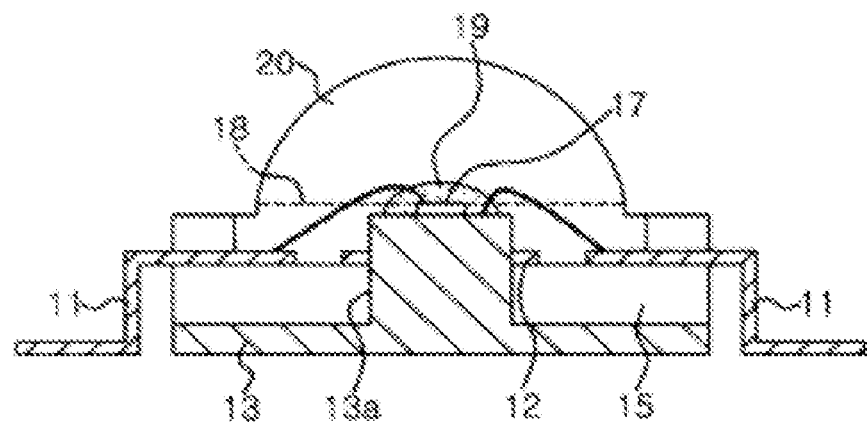
FIG. 1 is a sectional view illustrating a light emitting device with a silicone lens according to an embodiment of the present invention.

Hereinafter, a preferred embodiment of the present invention will be described in detail with reference to the accompanying drawings. The following embodiment is provided only as an example to fully convey the spirit and scope of the present invention to those skilled in the art. Therefore, the present invention is not limited to the following embodiment but may be implemented in various other forms. In the drawings, the width, length, thickness and the like of components may be exaggerated for convenience of illustration. Like reference numerals indicate like elements throughout the specification and drawings.

Figure 2:
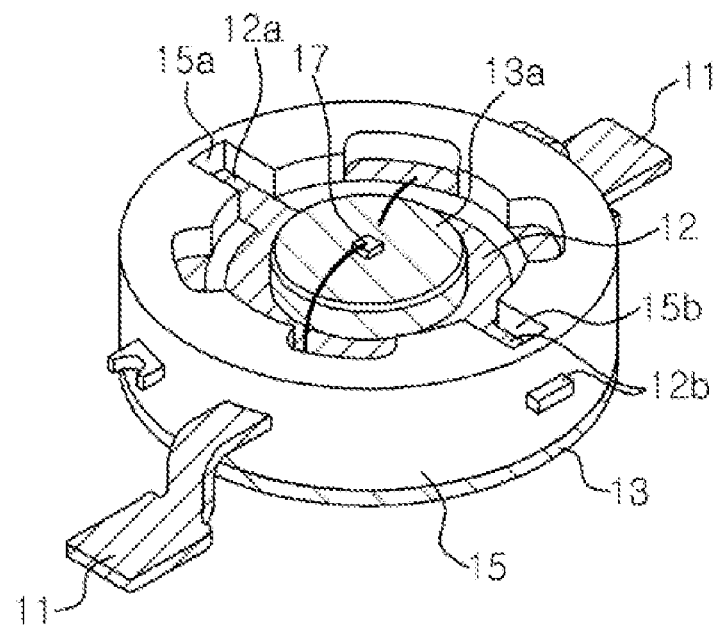
FIG. 2 is a perspective view illustrating the light emitting device according to an embodiment of the present invention.

FIGS. 1 and 2 are sectional and perspective views illustrating a light emitting device according to an embodiment of the present invention.

Referring to FIGS. 1 and 2, a package body 15 surrounds a heat sink 13. The heat sink 13 is fitted into a support ring 12 such that it is possible to prevent the heat sink from being separated from the package body 15.

The heat sink 13 transmits and dissipates heat produced from a light emitting diode 17 to the outside. To promote heat dissipation, the heat sink 13 may be formed with a large bottom surface and may have a projection 13a for mounting the light emitting diode 17 on the center thereof. The projection 13a is fitted into the support ring 12.

Further, lead electrodes 11 are supported by the package body 15. The package body 15 has an opening through which portions of the lead electrodes 11 can be exposed to the outside, and the lead electrodes 11 extend to protrude toward the outside of the package body 15. As shown in these figures, the outwardly protruding lead electrodes 11 may be bent such that they can be surface mounted.

The support ring 12 and the lead electrodes 11 may be provided using the same lead frame. That is, a metal plate is first punched to form a lead frame with a pattern of the support ring 12 and lead electrodes 11, and the support ring 12 and lead electrodes 11 can be then obtained from the lead frame. The support ring 12 includes a first ring connecting portion 12a and a second ring connecting portion 12b, both of which are formed in the package body 15 and extended toward the outside of the package body 15.

The package body 15 can be formed in such a manner that the heat sink 13 is first fitted into the support ring 12 of the lead frame and the lead frame and the heat sink 13 are then insert molded using a thermosetting or thermoplastic resin.

The light emitting diode 17 is mounted on the heat sink 13 and connected electrically to the lead electrodes 11. The light emitting diode 17 has two electrodes. The two electrodes may be positioned on one side of the light emitting diode 17. In this case, bonding wires are connected to the two electrodes, respectively. On the contrary, the two electrodes may be positioned on both sides of the light emitting diode 17, respectively. At this time, one electrode may be electrically connected to the heat sink 13 by means of a conductive adhesive while the other electrode may be connected to the bonding wire. Further, the light emitting diode 17 may have a flip chip structure. In this case, a submount (not shown) may be interposed between the light emitting diode 17 and the heat sink 13, and the bonding wires may connect the submount and the lead electrodes 11. The light emitting diode 17 may have a variety of structures, and a method of electrically connecting the light emitting diode and the lead electrodes 11 may be selected in various ways.

Furthermore, a top surface of the light emitting diode 17, i.e. a light emitting surface 18 (indicated by dotted lines) may be positioned higher than that of the package body 15. Since the top surface of the light emitting diode 17 is positioned higher than that of the package body 15, light emitted from the light emitting diode 17 can be prevented from being reflected on an inner wall of the opening of the package body 15.

The position of the light emitting diode 17 is determined depending on the height of the top surface of the heat sink 13. Thus, the top surface of the heat sink 13 is positioned near the top surface of the package body so that the top surface of the light emitting diode 17 can be positioned higher than at least a top surface of the package body. The top surface of the heat sink 13 may be positioned on the same plane as or higher than that of the package body 15.

A silicone lens 20 covers the light emitting diode 17 and the bonding wires. The silicone lens 20 is molded by injecting and curing a silicone material on the package body 15. At this time, a die (not shown) having the shape corresponding to a lens is coupled to the package body 15 and a silicone material is injected between the die and the package body 15 to be molded into the silicone lens 20. The silicone material is injected through a resin injection port 15a, and air between the die and the package body 15 is discharged through an air discharge port 15b. Accordingly, a space between the die and the package body 15 is filled with the silicone material which in turn is cured to form the silicone lens 20.

Similar to a conventional silicone encapsulant, the silicone lens 20 protects the light emitting diode and the bonding wires from external environment, i.e. moisture and external force, and also functions as a lens capable of adjusting the viewing angle and emission direction of light. The silicone lens is molded directly onto a package body instead of forming a lens through a separate process and then attaching the lens to a light emitting device so that a process of manufacturing the light emitting device can be simplified. Further, since the silicone lens is formed through a molding process, the reduction in light extraction efficiency due to refractive index difference and poor interface between lens and encapsulant, or the like can be prevented.

Furthermore, a silicone encapsulant 19 may be interposed between the light emitting diode 17 and the silicone lens 20. The silicone encapsulant 19 is formed to cover the light emitting diode 17 before the silicone lens 20 is molded over the light emitting device. Although the silicone encapsulant 19 may be formed on the top surface of the heat sink 13 as shown in FIG. 1, the present invention is not limited thereto. That is, the silicone encapsulant may be formed to fill the opening therewith. Than, the silicone lens 20 is molded onto the silicone encapsulant. The silicone encapsulant 19 can be cured simultaneously while the silicone lens 20 is cured.

Since the silicone encapsulant 19 and the silicone lens 20 are made of the same material as silicone, adhesion between them is satisfactory. Thus, a poor interface can be prevented and light loss due to refractive index difference can also be prevented.

Meanwhile, the silicone encapsulant 19 and/or the silicone lens 20 may contain phosphors for converting the wavelength of a portion of light emitted from the light emitting diode 17. Accordingly, it is possible to implement polychromatic light, e.g. white light, even by using the light emitting diode 17 that emits light with a single wavelength.

In a case where the silicone encapsulant 19 is employed, it is preferred that the silicone encapsulant 19 have hardness lower than that of the silicone lens 20. Accordingly, stress between the light emitting diode 17 and the silicone encapsulant 19 can be alleviated such that open failures can be further reduced and deformation of the silicone lens 20 due to external force can also be prevented.

Meanwhile, the top surface of the light emitting diode 17 is positioned higher than that of the package body 15. Accordingly, light emitted from the light emitting diode 17 is incident directly on the silicone lens 20. That is, light that has been reflected on the inner wall of the package body 15 and has been then incident on the lens 20 is removed in this embodiment. Thus, the path of light incident from the light emitting diode 17 to the silicone lens 20 can be simplified, so that it is possible to easily design the silicone lens 20.

The silicone lens 20 may have a variety of shapes in accordance with required characteristics. For example, the silicone lens 20 may take the shape of a convex lens to increase light output within a narrow viewing angle, whereas the lens may take the shape of a concave lens to disperse light at a broad viewing angle. Further, a variety of lenses with a total internal reflection surface may be employed to adjust the emission direction of light.

Figure 3:
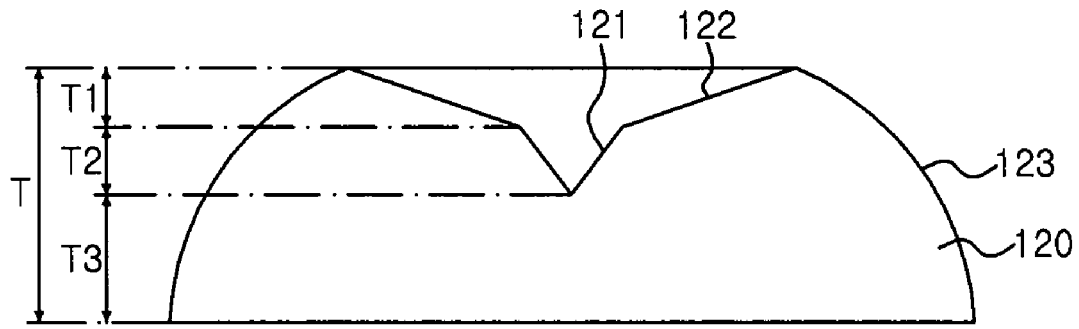
FIGS. 3 and 4 are sectional and plan views illustrating a lens attached to the light emitting device according to an embodiment of the present invention.
Figure 4:
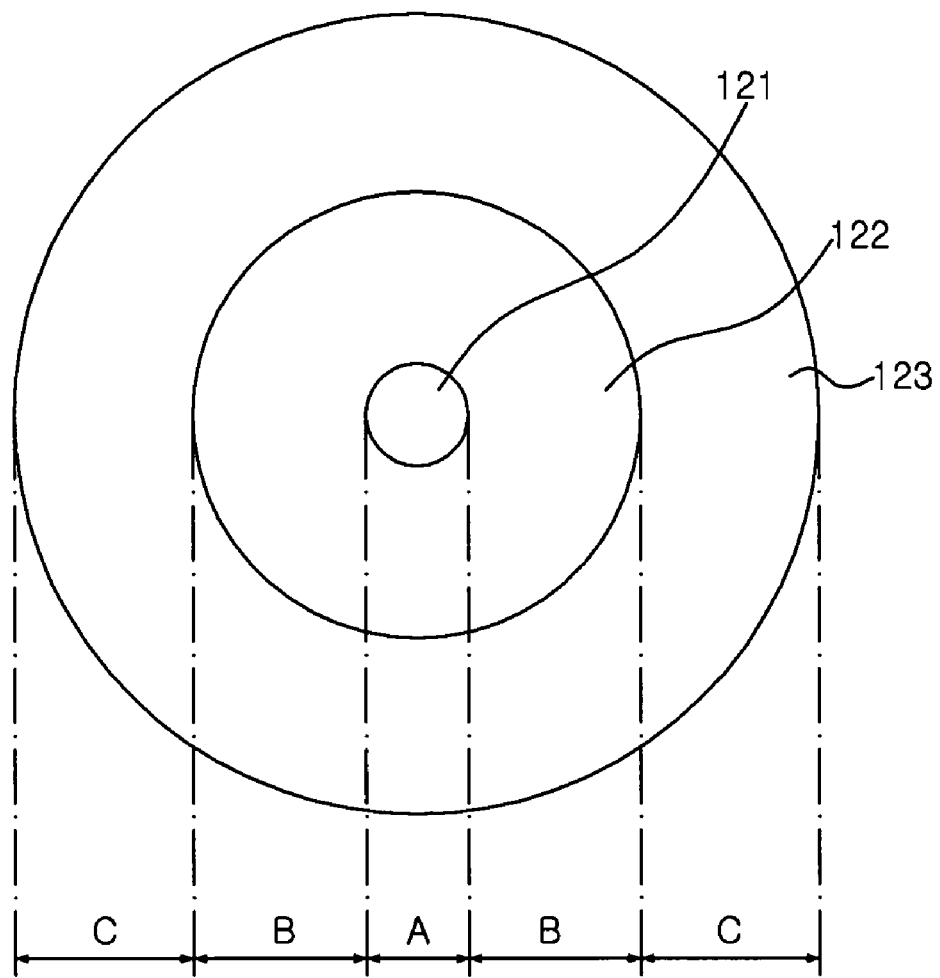

FIGS. 3 and 4 are sectional and plan views illustrating an example of a silicone lens 120 having a total internal reflection surface for emitting light in a lateral direction. For convenience of illustration, a lens above the light emitting plane 18 in FIG. 1 is illustrated, and the silicone encapsulant 19 in FIG. 1 and the silicone lens 20 in FIG. 1 are not discriminated from each other.

Referring to FIGS. 3 and 4, the lens 120 of this embodiment is formed into a body of which section is approximately a semi-ellipse. The lens 120 includes a first V-shaped (or conical) total internal reflection surface 121 with a predetermined slope and a second total internal reflection surface 122 with a gentler slope than that of the first total internal reflection surface 121, which are formed at the center of the lens. A refractive surface 123 extends from the second total reflection surface 122 to be rounded downward.

The lens 120 will be specifically discussed. The first total internal reflection surface 121 is formed as a V-shaped (or conical) recess above the light emitting diode 17, the refractive surface 123 is formed to be rounded on an edge of the lens, and the second total internal reflection surface 122 is formed to be inclined upward between the recess and the edge of the lens. Further, assuming that the total height T of the lens 120 is 1 as shown in FIG. 3, the height T2 of the first total internal reflection surface 121 is within a range of ½ to ¼ and the height T1 of the second total internal reflection surface 122 is within a range of ½ to ¼. The height T3 measured from a bottom surface of the lens 120 to the lowermost point in the V-shaped recess is ½ or less. As shown in FIG. 3, the height of the refractive surface is the same as the total height of the lens. Further, as shown in FIG. 4, if it is assumed that the total diameter A+2B+2C of the lens 120 is 1, the diameter A of the first total internal reflection surface 121 is within a range of ⅓ to ⅛ and the diameter A+2B of the second total reflection surface 122 is within a range of ½ to ⅙.

Furthermore, the refractive surface is elliptically shaped, and a ratio of minor and major axes of an ellipse is within a range of 1:2 to 1:4. Preferably, a ratio of minor and major axes is 1:3.

At this time, each of the total internal reflection surfaces 121 and 122 has a slope at which light emitted from the light emitting diode 17 to be incident on the total internal reflection surface 121 or 122 is totally reflected. That is, the slope of the total reflection surface 121 or 122 is set such that an angle defined by the total reflection surface and light emitted from the light emitting diode 17 to be incident on the total internal reflection surface becomes greater than a critical angle. The critical angle is determined by the refractive index of the lens 120. Since the silicone lens generally has a refractive index greater than an epoxy lens, the critical angle is advantageously large. In this embodiment, a silicone lens 120 with a refractive index corresponding to a critical angle of 30 to 60 degrees can be selected. Meanwhile, in order that an angle defined by light incident from the light emitting diode 17 and the total internal reflection surface 121 or 122 is equal to or greater than the critical angle, the slope of the first total internal reflection surface 121 can be within a range of 30 to 89 degrees and the slope of the second total internal reflection surface 122 can be within a range of 20 to 60 degrees. Preferably, the slope of the first total internal reflection surface 121 is between 40 to 70 degrees and the slope of the second total internal reflection surface 122 is between 30 to 50 degrees.

The light emitted from the light emitting diode 17 is incident on the lens 120, is totally reflected from the total internal reflection surface 121 or 122 to a side of the lens 120 and is then refracted through a single elliptical refractive surface 123 to be emitted generally in a horizontal direction. Meanwhile, the light incident directly on the refractive surface is refracted on the refractive surface 123 and then emitted generally in the horizontal direction.

If the lens 120 of this embodiment is employed, a backlight device capable of emitting light broadly in a lateral direction can be provided.

The invention claimed is:

1. A light emitting device, comprising:
   a heat sink;
   a package body surrounding at least a portion of the heat sink;
   a light emitting diode mounted on the heat sink such that a top surface of the light emitting diode is positioned at least above a top surface of the package body;
   a silicone lens molded on the package body to cover the light emitting diode; and
   a first lead electrode and a second lead electrode embedded in and extending outside of the package body,
   wherein a bottom surface of the silicone lens is below the top surface of the package body,
   wherein the package body comprises insert molded resin and an air discharge port,
   wherein the heat sink is disposed in a support ring, and the heat sink and the support ring contact the package body,
   wherein the support ring comprises a first ring connecting portion and a second ring connecting portion,
   wherein the first and second ring connecting portions are formed in the package body and extend to an outside surface of the package body,
   wherein the silicone lens comprises a protrusion, and the silicone lens protrusion fills the discharge port, and
   wherein the protrusion is arranged directly on the first and second ring connecting portions.

2. The light emitting device as claimed in claim 1, further comprising a silicone encapsulant interposed between the silicone lens and the light emitting diode to cover the light emitting diode.

3. The light emitting device as claimed in claim 2, wherein the silicone lens and/or silicone encapsulant contain a phosphor for converting the wavelength of light emitted from the light emitting diode.

4. The light emitting device as claimed in claim 2, wherein the silicone encapsulant is arranged directly on only the heat sink, the light emitting diode, and at least one wire.

5. The light emitting device as claimed in claim 2, wherein the silicone encapsulant comprises a hardness lower than a hardness of the silicone lens.

6. The light emitting device as claimed in claim 1, wherein a top surface of the heat sink is positioned at the same plane as or higher than the top surface of the package body.

7. The light emitting device as claimed in claim 1, wherein the silicone lens comprises:
   a refractive surface on an outer edge portion thereof; and
   total internal reflection surfaces with different slopes on a central portion thereof.

8. The light emitting device as claimed in claim 7, wherein each of the total internal reflection surfaces is inclined to totally reflect light incident from the light emitting diode onto the refractive surface.

9. The light emitting device as claimed in claim 8, wherein the total reflection surfaces comprise:
   a first total internal reflection surface in the form of a V-shaped recess with a predetermined slope; and
   a second total internal reflection surface with a slope smaller than the slope of the first total internal reflection surface between the first total internal reflection surface and the refractive surface.

10. The light emitting device as claimed in claim 9, wherein the refractive surface extends from the second total reflection surface to be rounded downward.

11. The light emitting device as claimed in claim 1, wherein the heat sink comprises a projection, and the top surface of the package body and the heat sink projection are separated by the silicone lens.

12. The light emitting device as claimed in claim 1, wherein a side surface of the silicone lens is surrounded by an inner side surface of the package body.

13. The light emitting device as claimed in claim 1, wherein the bottom surface of the silicone lens is arranged directly on the heat sink.

14. The light emitting device as claimed in claim 1, wherein the package body comprises a resin injection port,
   wherein the resin injection port and the air discharge port are formed between an inner surface and an outside surface of the package body, and are exposed by the top surface of the package body.

15. The light emitting device as claimed in claim 14, wherein the resin injection port and the air discharge port extend closer to the outside surface of the package body than a plurality of cutaway portions of the package body exposing the first lead electrode and the second lead electrode.

* * * * *

UNITED STATES PATENT AND TRADEMARK OFFICE
CERTIFICATE OF CORRECTION

| | | |
|---|---|---|
| PATENT NO. | : 8,283,693 B2 | Page 1 of 1 |
| APPLICATION NO. | : 11/997459 | |
| DATED | : October 9, 2012 | |
| INVENTOR(S) | : Lee et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 676 days.

Signed and Sealed this
Tenth Day of June, 2014

Michelle K. Lee
*Deputy Director of the United States Patent and Trademark Office*